US012684881B2

(12) United States Patent
Tai et al.

(10) Patent No.: US 12,684,881 B2
(45) Date of Patent: Jul. 14, 2026

(54) DISPLAY DEVICE AND DISPLAY PANEL

(71) Applicant: Novatek Microelectronics Corp.,
Hsinchu (TW)

(72) Inventors: Ya-Hsiang Tai, Miaoli County (TW);
Yi-Cheng Yuan, New Taipei City
(TW); Chen-Yu Lin, Taichung City
(TW)

(73) Assignee: Novatek Microelectronics Corp.,
Hsinchu (TW)

( * ) Notice: Subject to any disclaimer, the term of this
patent is extended or adjusted under 35
U.S.C. 154(b) by 702 days.

(21) Appl. No.: 18/155,760

(22) Filed: Jan. 18, 2023

(65) Prior Publication Data

US 2024/0153970 A1        May 9, 2024

Related U.S. Application Data

(60) Provisional application No. 63/422,008, filed on Nov.
3, 2022.

(51) Int. Cl.
H10F 39/00 (2025.01)
H04N 25/78 (2023.01)
(52) U.S. Cl.
CPC ......... H10F 39/8037 (2025.01); H04N 25/78
(2023.01); H10F 39/8053 (2025.01)
(58) Field of Classification Search
CPC . H10F 39/8037; H10F 39/8053; H04N 25/78;
G09G 2320/0626; G09G 2360/144
See application file for complete search history.

(56) References Cited

U.S. PATENT DOCUMENTS

| | | | |
|---|---|---|---|
| 6,469,289 B1* | 10/2002 | Scott-Thomas ........ | H04N 25/76 |
| | | | 348/E3.018 |
| 7,682,883 B2 | 3/2010 | Cho et al. | |
| 8,415,182 B2 | 4/2013 | Cho et al. | |
| 9,733,773 B2 | 8/2017 | Yang et al. | |
| 2009/0280606 A1* | 11/2009 | Shih ........................ | H10F 30/15 |
| | | | 257/E21.409 |
| 2009/0286336 A1 | 11/2009 | Cho et al. | |
| 2010/0099206 A1 | 4/2010 | Cho et al. | |

(Continued)

FOREIGN PATENT DOCUMENTS

| | | |
|---|---|---|
| TW | 200950066 | 12/2009 |
| TW | 201106044 | 2/2011 |
| TW | 201541301 | 11/2015 |

OTHER PUBLICATIONS

"Office Action of Taiwan Counterpart Application", issued on Jun.
6, 2024, p. 1-p. 6.

(Continued)

*Primary Examiner* — Tucker J Wright
(74) *Attorney, Agent, or Firm* — JCIPRNET

(57) ABSTRACT

The invention provides a display device and a display panel.
The display device includes the display panel and a reading
circuit. The display panel includes an upper substrate, a
lower substrate, a thin-film transistor (TFT) layer, and a
photosensitive circuit. The TFT layer is disposed between
the upper substrate and the lower substrate. A plurality of
TFTs of a pixel array of the display panel are disposed in the
TFT layer. The photosensitive circuit is disposed in the TFT
layer to sense an ambient light. The reading circuit is
coupled to the photosensitive circuit to read a sensing result.

22 Claims, 8 Drawing Sheets

(56) References Cited

U.S. PATENT DOCUMENTS

| | | | | |
|---|---|---|---|---|
| 2010/0140622 | A1* | 6/2010 | Lee | H10K 59/1213 |
| | | | | 257/E29.294 |
| 2011/0096035 | A1 | 4/2011 | Shen | |
| 2015/0301652 | A1 | 10/2015 | Yang et al. | |
| 2017/0039931 | A1* | 2/2017 | Kubota | G09G 5/363 |
| 2022/0278233 | A1* | 9/2022 | Bähr | H10D 62/314 |

OTHER PUBLICATIONS

Can Huang et al., "High Accuracy In-Cell Integrated Ambient Light and Color Temperature Sensor LCD", Society for Information Display, vol. 53, Issue 1, Jun. 28, 2022, pp. 121-124.
Kenneth J. Vampola et al., "Through-OLED Display Ambient Color Sensing", Society for Information Display, vol. 53, Issue 1, Jun. 28, 2022, pp. 117-120.

* cited by examiner

DISPLAY DEVICE AND DISPLAY PANEL

CROSS-REFERENCE TO RELATED APPLICATION

This application claims the priority benefit of U.S. provisional application Ser. No. 63/422,008, filed on Nov. 3, 2022. The entirety of the above-mentioned patent application is hereby incorporated by reference herein and made a part of this specification.

BACKGROUND OF THE INVENTION

Field of the Invention

The invention relates to an electronic device, and in particular to a display device and a display panel.

Description of Related Art

A color temperature sensor uses the same circuit architecture as an ambient light sensor (ALS), but the color temperature sensor is covered with a color filter film. Different colors of light are sensed via different color filter films, and then the back-end processing circuit integrates and calculates the sensing values of the different colors to obtain a color temperature value. Generally, the ALS (or color temperature sensor) includes a PIN-type photodiode. The element manufacturing process of the PIN-type photodiode is quite incompatible with the display panel manufacturing process. Therefore, in the existing display device, the ALS (or color temperature sensor) and the display panel are independent and different members. The ALS (color temperature sensor) is disposed on the back of the display panel. Ambient light may irradiate the ALS (color temperature sensor) via the display panel. Since ambient light needs to pass through all layers of the display panel, the intensity of light reaching the sensor is too low. This is the issue of low signal display transmission.

The second issue with the existing ALS (color temperature sensor) is optical crosstalk display back-emission. The image light displayed on the display panel may be reflected by some layers of the display panel (this is called back reflection), resulting in optical crosstalk.

Moreover, the operation process of the existing ALS (color temperature sensor) has three working stages: reset charging, exposure, and electric signal collection. First, a high voltage is applied to the sensor circuit in the reset charging phase, followed by the exposure phase, and lastly an electrical signal is collected. This existing sensor requires an integration time to process the sensing result, resulting in a longer reading time.

It should be noted that the content of the "prior art" paragraphs is used to help understand the invention. Part of the content (or all of the content) disclosed in the "prior art" paragraphs may not be conventional techniques known to those having ordinary skill in the art. The content disclosed in the "prior art" paragraphs does not mean that the content has been known to those having ordinary skill in the art before the application of the invention.

SUMMARY OF THE INVENTION

The invention provides a display device and a display panel to sense ambient light.

In an embodiment of the invention, a display panel includes an upper substrate, a lower substrate, a thin-film transistor (TFT) layer, and a photosensitive circuit. The TFT layer is disposed between the upper substrate and the lower substrate. A plurality of TFTs of a pixel array of the display panel are disposed in the TFT layer. The photosensitive circuit is disposed in the TFT layer to sense an ambient light.

In an embodiment of the invention, the display device includes a display panel and a reading circuit. The display panel includes an upper substrate, a lower substrate, a TFT layer, and a photosensitive circuit. The TFT layer is disposed between the upper substrate and the lower substrate. A plurality of TFTs of a pixel array of the display panel are disposed in the TFT layer. The photosensitive circuit is disposed in the TFT layer to sense an ambient light. The reading circuit is coupled to the photosensitive circuit to read a sensing result.

Based on the above, the display panel of the embodiments of the invention has a photosensitive circuit. The photosensitive circuit is embedded in the TFT layer of the display panel, so ambient light may reach the photosensitive circuit through a few layers of the display panel, thereby alleviating the low signal display transmission issue. Moreover, the sensing operation of the photosensitive circuit does not need to be divided into three working stages: reset charging, exposure, and electric signal collection, so the reading time may be shortened.

In order to make the aforementioned features and advantages of the disclosure more comprehensible, embodiments accompanied with figures are described in detail below.

DESCRIPTION OF THE EMBODIMENTS

Figure 1:
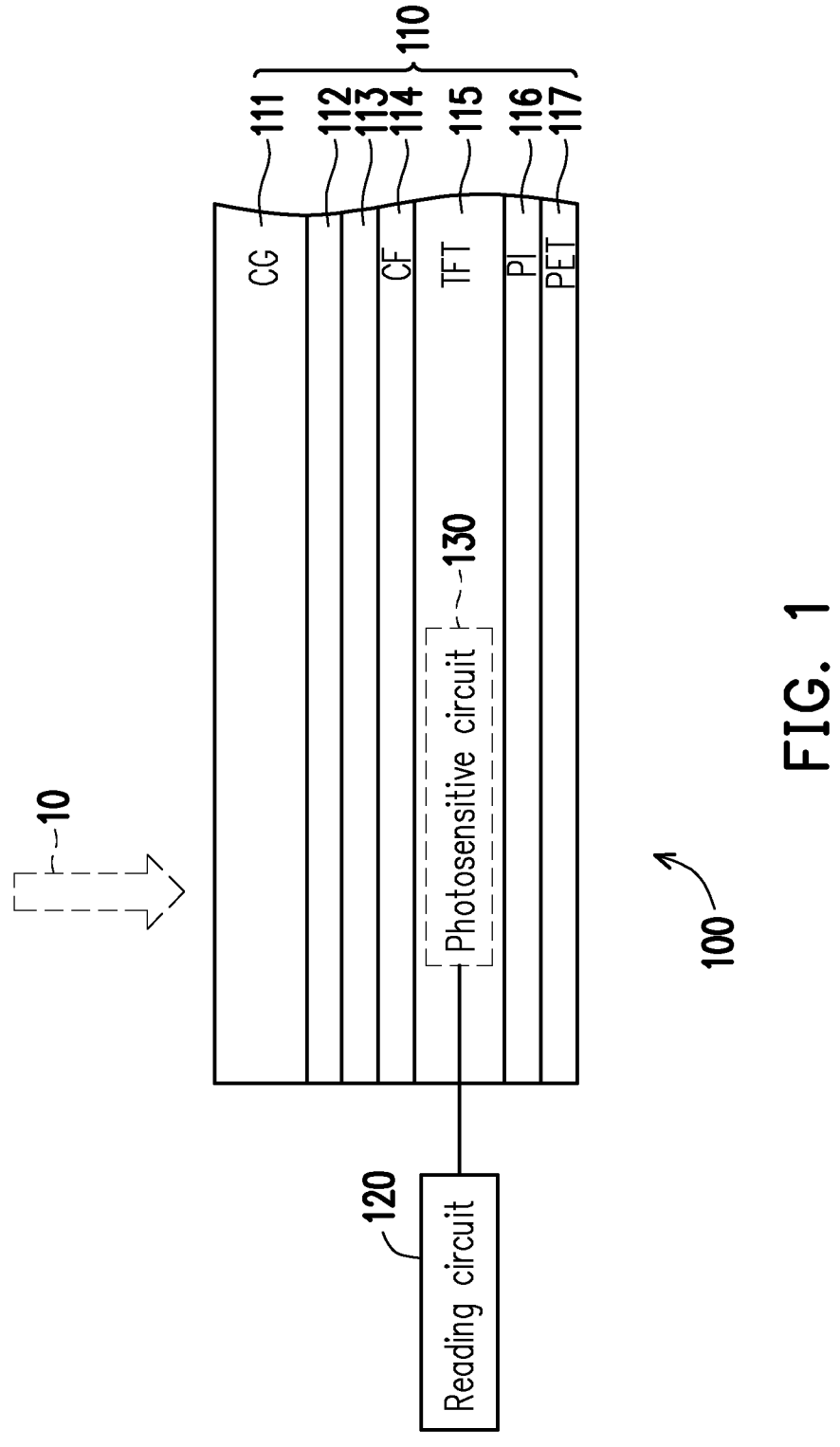
FIG. 1 is a schematic diagram of a display device according to an embodiment of the invention.

The term "coupled to (or connected to)" used in the entire text of the specification of the present application (including claims) may refer to any direct or indirect connecting means. For example, if the text describes a first device is coupled to (or connected to) a second device, then it should be understood that the first device may be directly connected to the second device, or the first device may be indirectly connected to the second device via other devices or certain connecting means. Terms such as "first" and "second"

mentioned in the entire specification of the present application (including the claims) are used to name the elements or to distinguish different embodiments or ranges, and are not used to restrict the upper or lower limits of the number of elements, nor are they used to limit the order of the elements. Moreover, when applicable, elements/members/steps having the same reference numerals in figures and embodiments represent the same or similar parts. Elements/members/steps having the same reference numerals or having the same terminology in different embodiments may be cross-referenced.

The following embodiments illustrate a display panel embedded with a photosensitive circuit. The photosensitive circuit adopts a high photosensitive current element. In the absence of a color filter film covering the photosensitive circuit, the photosensitive circuit may be used as an ambient light sensor (ALS). In the case that a color filter film covers the photosensitive circuit, the photosensitive circuit may be used as a color temperature sensor.

FIG. 1 is a schematic diagram of a display device 100 according to an embodiment of the invention. The display device 100 includes the display panel 110 and a reading circuit 120. FIG. 1 shows a schematic cross-sectional view of the display panel 110. The display panel 110 includes an upper substrate, a lower substrate, a thin-film transistor (TFT) layer 115, and a photosensitive circuit 130. The TFT layer 115 is disposed between the upper substrate and the lower substrate, and a plurality of TFTs (not shown) of a pixel array of the display panel 110 are disposed in the TFT layer 115. The specific structure of the display panel 110 may be determined according to actual design. Taking the display panel 110 shown in FIG. 1 as an example, the upper substrate of the display panel 110 may include a cover glass (CG) 111, and the lower substrate of the display panel 110 may include a polyimide (PI) film 116 and a polyester (PET) film 117. The PI film 116 may be used as an alignment film. In the embodiment shown in FIG. 1, the display panel 110 may further include a polarizing film 112, an encapsulation layer 113, and a color filter (CF) film 114. The polarizing film 112 is disposed between the cover glass 111 (upper substrate) and the TFT layer 115. The CF film 114 is disposed between the polarizing film 112 and the TFT layer 115.

The photosensitive circuit 130 is disposed in the TFT layer 115 of the display panel 110 to sense the ambient light 10. Based on actual design, the photosensitive circuit 130 is disposed at the edge portion of the display panel 110 or other positions. The reading circuit 120 is electrically coupled to the photosensitive circuit 130 to read the sensing result of the photosensitive circuit 130. In some embodiments, the sensing result of the photosensitive circuit 130 may be a photocurrent in response to the ambient light 10 (e.g., the greater the intensity of the ambient light 10, the greater the photocurrent). In some embodiments, the sensing result of the photosensitive circuit 130 may be a photovoltage in response to the ambient light 10 (e.g., the greater the intensity of the ambient light 10, the less the photovoltage).

Based on the above, the photosensitive circuit 130 of the present embodiment is embedded in the TFT layer 115 of the display panel 110. Therefore, the ambient light 10 may reach the photosensitive circuit 130 through a few layers of the display panel 110 (the ambient light 10 does not need to pass through every layer of the display panel 110), thereby alleviating the issue of low signal display transmission.

Figure 2:
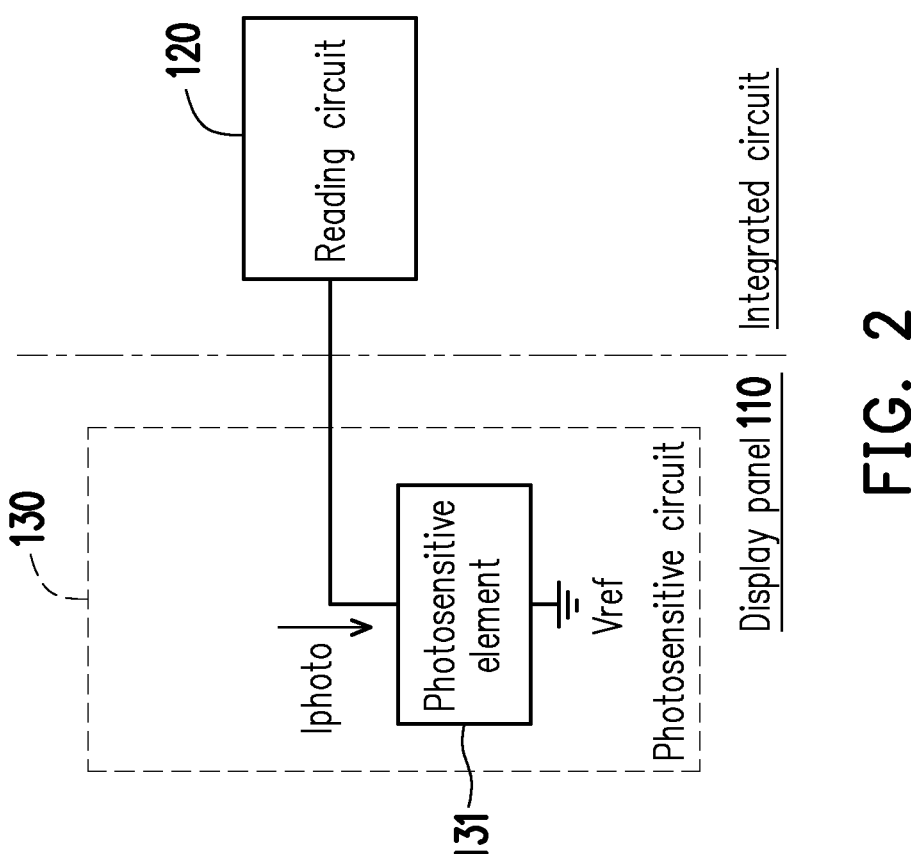
FIG. 2 is a schematic diagram of a circuit block of a photosensitive circuit according to an embodiment of the invention.

FIG. 2 is a schematic diagram of a circuit block of a photosensitive circuit 130 according to an embodiment of the invention. The photosensitive circuit 130 shown in FIG.

2 may be used as one of a plurality of embodiments of the photosensitive circuit 130 shown in FIG. 1. In the embodiment shown in FIG. 2, the photosensitive circuit 130 includes a photosensitive element 131. The first terminal and the second terminal of the photosensitive element 131 are respectively coupled to the reading circuit 120 and a reference voltage Vref. The level of the reference voltage Vref may be set according to actual design. The photosensitive element 131 may sense the ambient light 10 to determine a photocurrent Iphoto flowing through the photosensitive element 131. The reading circuit 120 reads the photocurrent Iphoto of the photosensitive element 131 to learn the intensity of the ambient light 10. The photocurrent Iphoto may be responsive to the intensity of the ambient light 10. For example, the greater the intensity of the ambient light 10, the greater the photocurrent Iphoto (and vice versa).

Based on actual design, the photosensitive element 131 may be any photosensitive element compatible with the manufacturing process of the display panel 100 (especially the manufacturing process of the TFT layer 115). For example, in some embodiments, the photosensitive element 131 may be a photosensitive TFT. The drain and the source of the photosensitive TFT are respectively coupled to the reading circuit 120 and the reference voltage Vref. The gate of the photosensitive TFT receives a bias voltage. Different bias voltages may determine the "relationship curve between the intensity of the ambient light 10 and the photocurrent Iphoto" of the photosensitive TFT. The bias voltage may be set according to actual design. In other embodiments, the photosensitive element 131 may be a silicon-rich oxide (SRO) element. In yet other embodiments, the photosensitive element 131 may be a gap-type TFT. The drain and the source of the gap-type TFT are respectively coupled to the reading circuit 120 and the reference voltage Vref. The gate of the gate-type TFT receives the bias voltage. The length of the gate of the gap-type TFT is less than the channel length between the source and the drain of the gap-type TFT.

Figure 3:
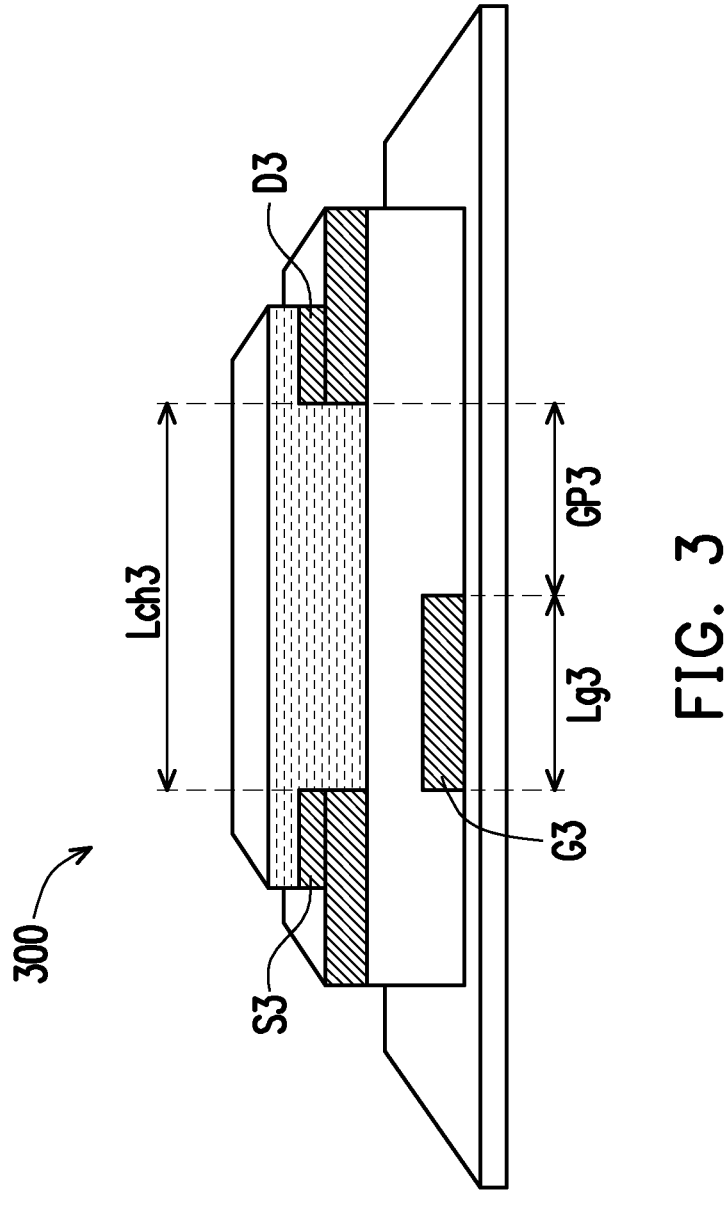
FIG. 3 is a schematic cross-sectional view of a gap-type TFT shown according to an embodiment of the invention.

FIG. 3 is a schematic cross-sectional view of a gap-type TFT 300 shown according to an embodiment of the invention. FIG. 3 shows a gate G3, a source S3, and a drain D3 of the gap-type TFT 300. A length Lg3 of the gate G3 of the gap-type TFT 300 is less than a channel length Lch3 between the source S3 and the drain D3 of the gap-type TFT 300. That is, the gap-type TFT 300 has a gap GP3 between the gate G3 and the drain D3. In the conduction region of the drain current versus gate voltage characteristic curve, the drain current of the gap-type TFT 300 is increased as the intensity of the ambient light 10 is increased, showing good lighting characteristics. When the gate G3 is at a negative voltage, the gap-type TFT 300 is turned off. The gap-type TFT 300 is compatible with the manufacturing process of the display panel 100 (especially the manufacturing process of the TFT layer 115), and may be a good photosensitive element.

Figure 4:
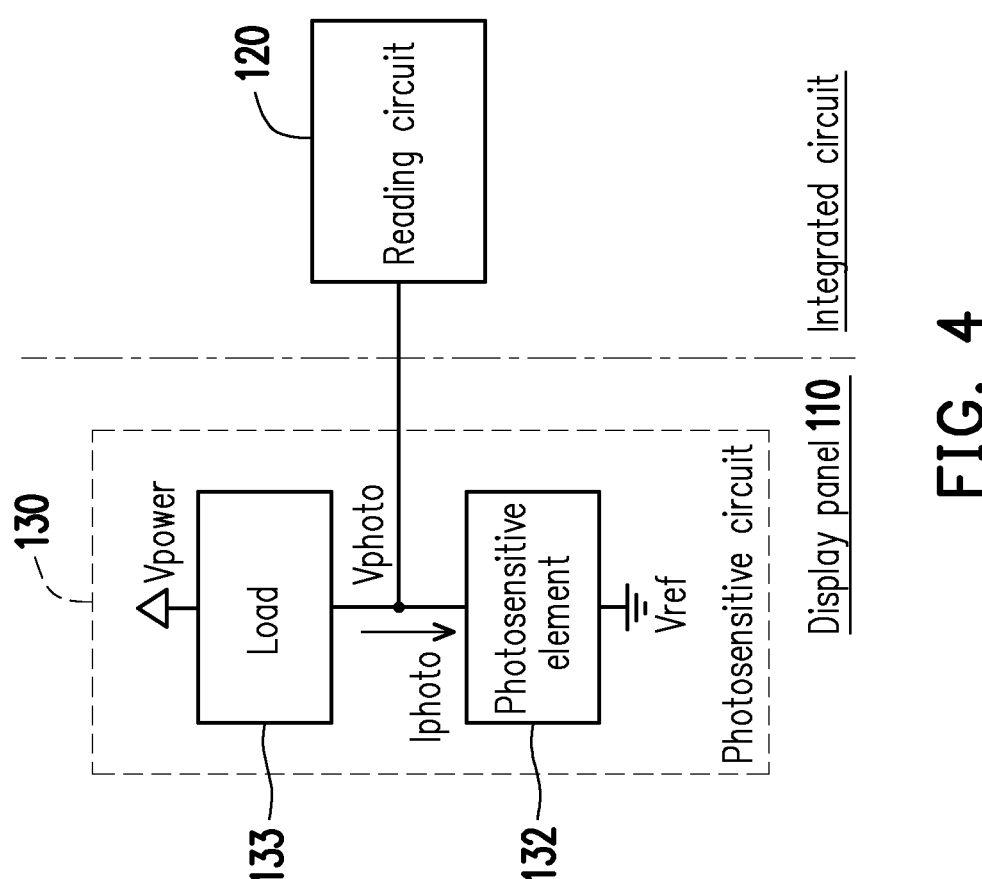
FIG. 4 is a schematic diagram of a circuit block of a photosensitive circuit according to another embodiment of the invention.

FIG. 4 is a schematic diagram of a circuit block of a photosensitive circuit 130 according to another embodiment of the invention. The photosensitive circuit 130 shown in FIG. 4 may be used as one of a plurality of embodiments of the photosensitive circuit 130 shown in FIG. 1. In the embodiment shown in FIG. 4, the photosensitive circuit 130 includes a photosensitive element 132 and a load 133. Based on actual design, the photosensitive element 132 may be any photosensitive element compatible with the manufacturing process of the display panel 100 (especially the manufacturing process of the TFT layer 115), and the load 133 may be any load element compatible with the manufacturing process of the display panel 100 (especially the manufacturing process of the TFT layer 115). For the photosensitive element 132 shown in FIG. 4, reference may be made to the related description of the photosensitive element 131 shown in FIG. 3 and analogized as such, so details are not repeated herein.

The first terminal and the second terminal of the photosensitive element 132 are respectively coupled to the reading circuit 120 and a reference voltage Vref. The photosensitive element 132 may sense the ambient light 10 to determine the photocurrent Iphoto flowing through the photosensitive element 132. The first terminal of the load 133 is coupled to a power voltage Vpower. The levels of the reference voltage Vref and the power voltage Vpower may be set according to actual design. The second terminal of the load 133 is coupled to the photosensitive element 132 to convert the photocurrent Iphoto into a photovoltage Vphoto. The reading circuit 120 reads the photovoltage Vphoto to learn the intensity of the ambient light 10. The photocurrent Iphoto may be responsive to the intensity of the ambient light 10. For example, the greater the intensity of the ambient light 10, the greater the photocurrent Iphoto, making the photovoltage Vphoto less (and vice versa).

Based on the above, the photosensitive element 132 (or 131) may instantly reflect the intensity of the ambient light 10 in the photocurrent Iphoto. Therefore, the sensing operation of the photosensitive circuit 130 does not need to be divided into three working stages: reset charging, exposure, and electric signal collection. Accordingly, compared with the operation process of the conventional ambient light sensor (color temperature sensor), the time for reading the photosensitive element 132 shown in FIG. 4 (or the photosensitive element 131 shown in FIG. 2) may be shortened.

Figure 5:
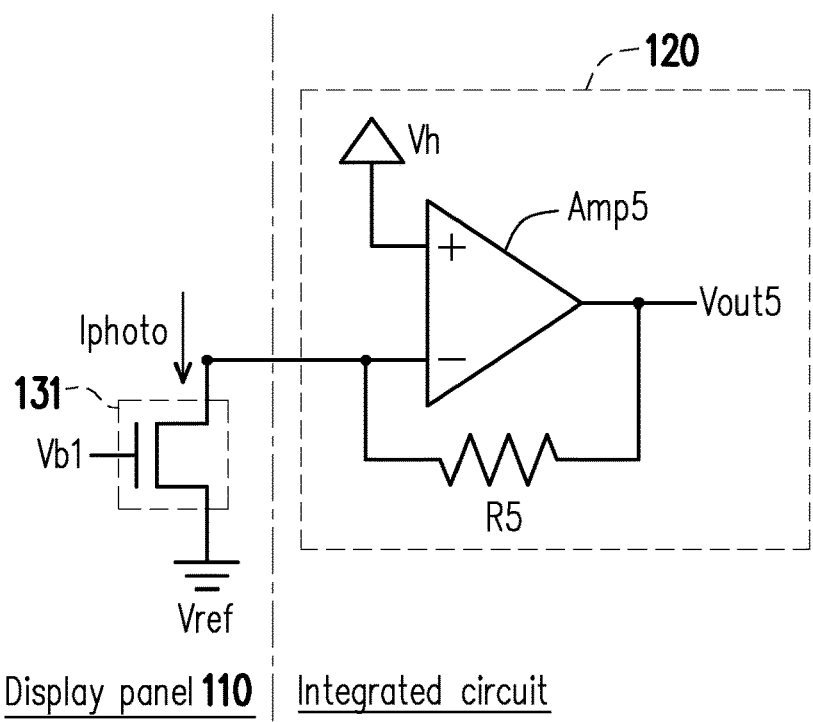
FIG. 5 is a schematic circuit block diagram of a reading circuit shown according to an embodiment of the invention.

FIG. 5 is a schematic circuit block diagram of a reading circuit 120 shown according to an embodiment of the invention. The photosensitive element 131 and the reading circuit 120 shown in FIG. 5 may be used as one of a plurality of embodiments of the photosensitive element 131 and the reading circuit 120 shown in FIG. 2. The gate of the photosensitive element 131 receives a bias voltage Vb1. Different bias voltages Vb1 may determine the "relationship curve between the intensity of the ambient light 10 and the photocurrent Iphoto" of the photosensitive element 131. The bias voltage Vb1 may be set according to actual design.

In the embodiment shown in FIG. 5, the reading circuit 120 includes an amplifier Amp5 and a resistor R5. The first input terminal (e.g., non-inverting input terminal) of the amplifier Amp5 is coupled to a reference voltage Vh. The level of the reference voltage Vh may be set according to actual design. The second input terminal (e.g., inverting input terminal) of the amplifier Amp5 is coupled to the photosensitive element 131. The first terminal of the resistor R5 is coupled to the second input terminal of the amplifier Amp5. The second terminal of the resistor R5 is coupled to the output terminal of the amplifier Amp5. An output voltage Vout5 of the amplifier Amp5 may be responsive to the intensity of the ambient light 10. For example, the greater the intensity of the ambient light 10, the greater the photocurrent Iphoto, making the output voltage Vout5 greater (and vice versa).

Figure 6:
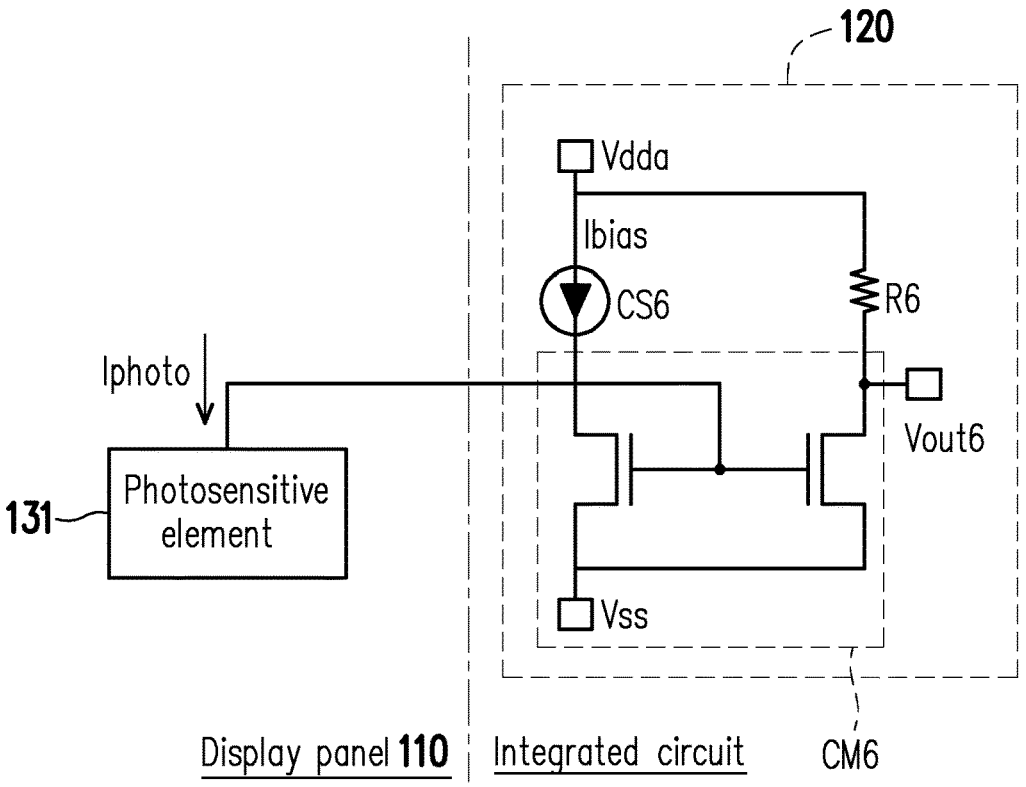
FIG. 6 is a schematic circuit block diagram of a reading circuit shown according to another embodiment of the invention.

FIG. 6 is a schematic circuit block diagram of a reading circuit 120 shown according to another embodiment of the invention. The photosensitive element 131 and the reading circuit 120 shown in FIG. 6 may be used as one of a plurality of embodiments of the photosensitive element 131 and the reading circuit 120 shown in FIG. 2. In the embodiment shown in FIG. 6, the reading circuit 120 includes a current source CS6, a resistor R6, and a current mirror CM6. The current source CS6 may provide a bias current Ibias. The first terminal of the resistor R6 is coupled to a power voltage Vdda. The levels of the power voltage Vdda and a reference voltage Vss shown in FIG. 6 may be set according to actual design. The master current terminal of the current mirror CM6 is coupled to the current source CS6 and the photosensitive element 131. The slave current terminal of the current mirror CM6 is coupled to the second terminal of the resistor R6. An output voltage Vout6 of the second terminal of the resistor R6 may respond to the intensity of the ambient light 10. For example, the greater the intensity of the ambient light 10, the greater the photocurrent Iphoto, making the output voltage Vout6 greater (and vice versa).

Figure 7:
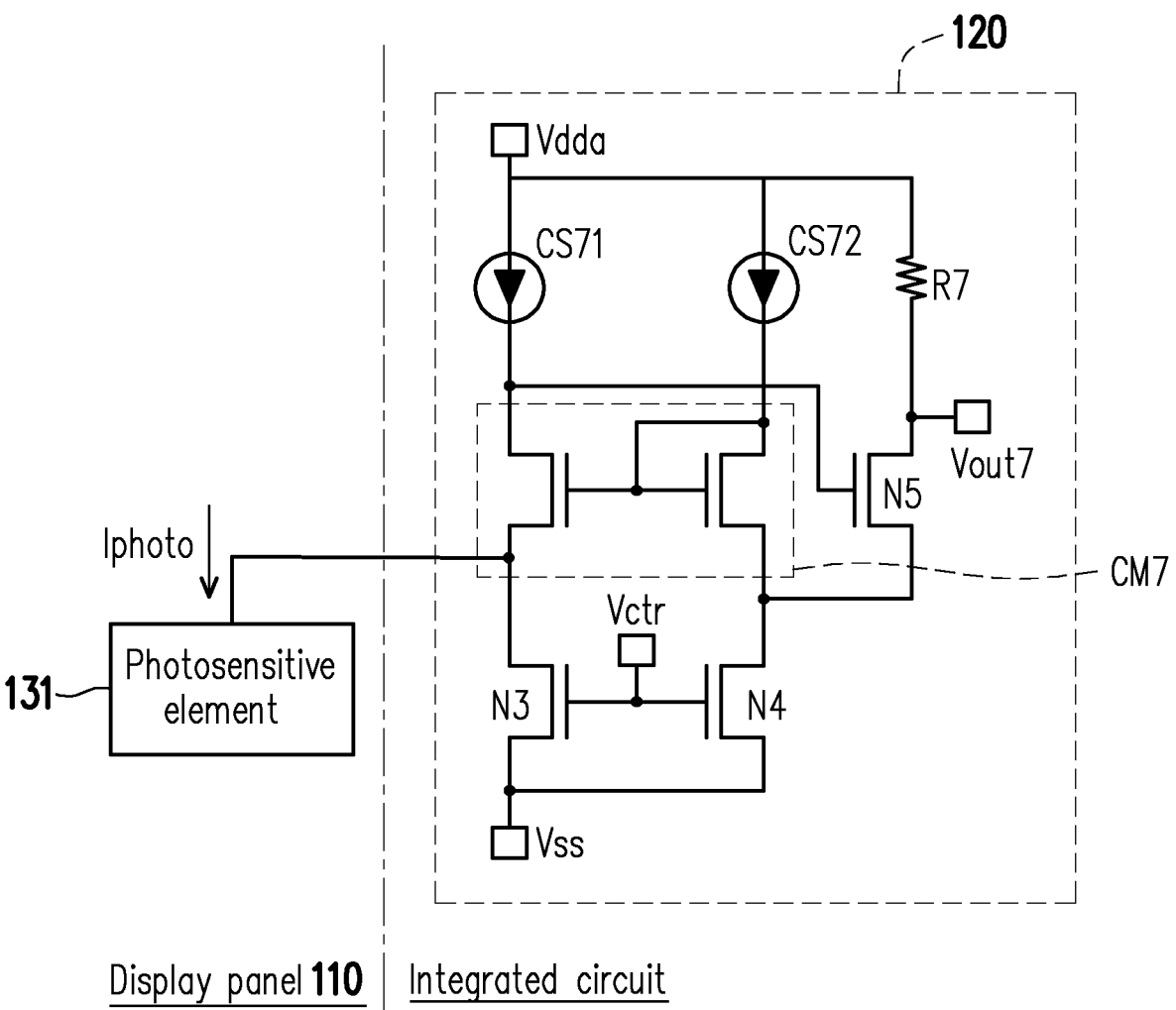
FIG. 7 is a schematic circuit block diagram of a reading circuit shown according to another embodiment of the invention.

FIG. 7 is a schematic circuit block diagram of a reading circuit 120 shown according to another embodiment of the invention. The photosensitive element 131 and the reading circuit 120 shown in FIG. 7 may be used as one of a plurality of embodiments of the photosensitive element 131 and the reading circuit 120 shown in FIG. 2. In the embodiment shown in FIG. 7, the reading circuit 120 includes a current source CS71, a current source CS72, a current mirror CM7, a transistor N3, a transistor N4, a transistor N5, and a resistor R7. The first terminal of the master current path of the current mirror CM7 is coupled to the current source CS72. The first terminal of the slave current path of the current mirror CM7 is coupled to the current source CS71. The second terminal of the slave current path of the current mirror CM7 is coupled to the photosensitive element 131. The first terminal (e.g., drain) of the transistor N4 is coupled to the second terminal of the master current path of the current mirror CM7. The second terminal (e.g., source) of the transistor N4 is coupled to the reference voltage Vss. The level of the reference voltage Vss shown in FIG. 7 may be set according to actual design. The control terminal (e.g., gate) of the transistor N4 is coupled to a control voltage Vctr. The level of the control voltage Vctr shown in FIG. 7 may be set according to actual design. The first terminal (e.g., drain) of the transistor N3 is coupled to the second terminal of the slave current path of the current mirror CM7. The second terminal (e.g., source) of the transistor N3 is coupled to the reference voltage Vss. The control terminal (e.g., gate) of the transistor N3 is coupled to the control voltage Vctr. The first terminal of the resistor R7 is coupled to the power voltage Vdda. The levels of the control voltage Vctr and the power voltage Vdda shown in FIG. 7 may be set according to actual design. The first terminal (e.g., drain) of the transistor N5 is coupled to the second terminal of the resistor R7. The second terminal (e.g., source) of the transistor N5 is coupled to the second terminal of the master current path of the current mirror CM7. The control terminal (e.g., gate) of the transistor N5 is coupled to the first terminal of the slave current path of the current mirror CM7. An output voltage Vout7 of the second terminal of the resistor R7 may respond to the intensity of the ambient light 10. For example, the greater the intensity of the ambient light 10, the greater the photocurrent Iphoto, making the output voltage Vout7 greater (and vice versa).

Figure 8:
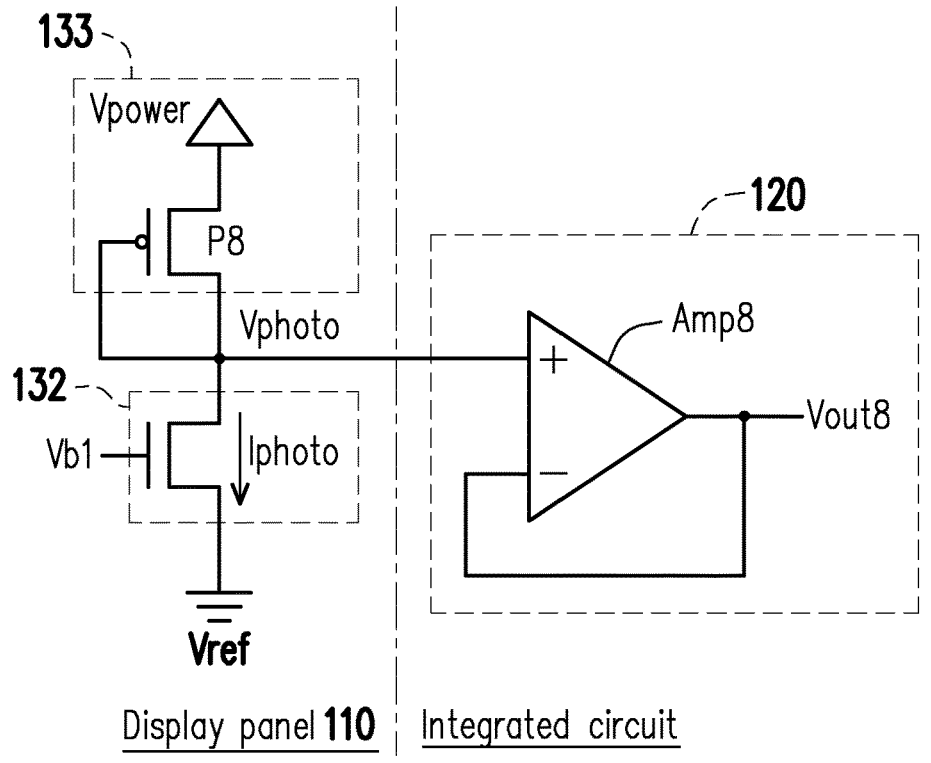
FIG. 8 is a schematic circuit block diagram of a load shown according to an embodiment of the invention.

FIG. 8 is a schematic circuit block diagram of a load 133 shown according to an embodiment of the invention. The photosensitive element 132, the load 133, and the reading circuit 120 shown in FIG. 8 may be used as one of a plurality of embodiments of the photosensitive element 132, the load 133, and the reading circuit 120 shown in FIG. 4. In the embodiment shown in FIG. 8, the load 133 includes a transistor P8. The first terminal (e.g., source) of the transistor P8 is coupled to the power voltage Vpower. The level of the power voltage Vpower shown in FIG. 8 may be set according to actual design. The second terminal (e.g., drain) of the transistor P8 is coupled to the photosensitive element 120. The control terminal (e.g., gate) of the transistor P8 is coupled to the second terminal of the transistor P8. The gate of the photosensitive element 132 receives the bias voltage Vb1. Different bias voltages Vb1 may determine the "relationship curve between the intensity of the ambient light 10 and the photocurrent Iphoto" of the photosensitive element 132. The bias voltage Vb1 may be set according to actual design.

In the embodiment shown in FIG. 8, the reading circuit 120 includes an amplifier Amp8. The first input terminal (e.g., non-inverting input terminal) of the amplifier Amp8 is coupled to the photosensitive element 132 and the load 1333 to receive the photovoltage Vphoto. The second input terminal (e.g., inverting input terminal) of the amplifier Amp8 is coupled to the output terminal of the amplifier Amp8. The output voltage Vout8 of the amplifier Amp8 may be responsive to the intensity of the ambient light 10. For example, the greater the intensity of the ambient light 10, the greater the photocurrent Iphoto (the less the photovoltage Vphoto), making the output voltage Vout8 less (and vice versa).

Figure 9:
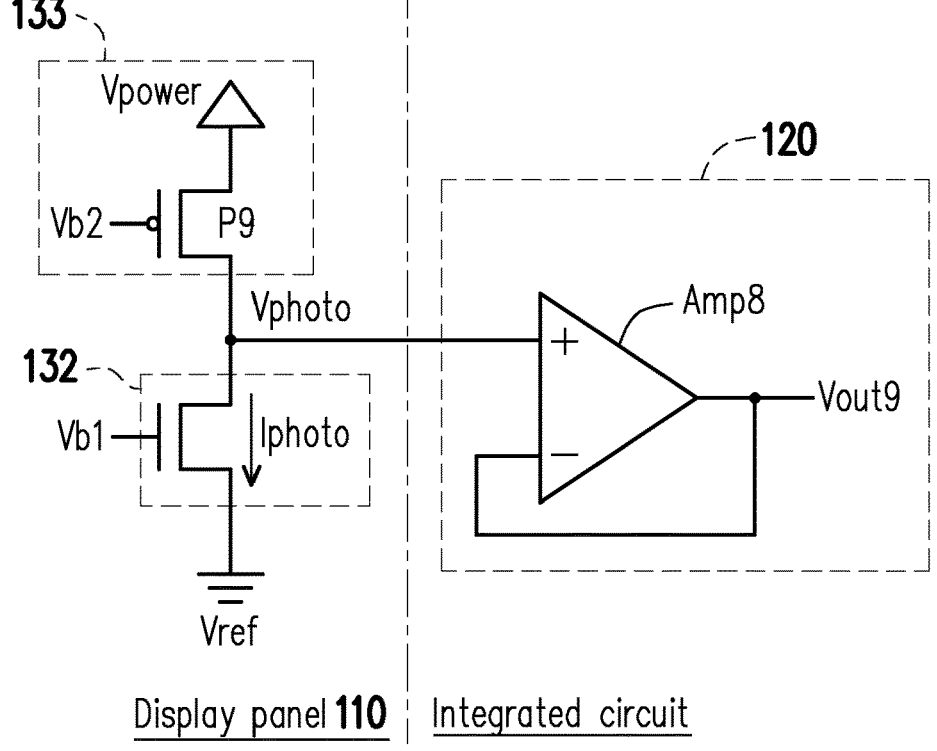
FIG. 9 is a schematic circuit block diagram of a load 133 shown according to another embodiment of the invention.

FIG. 9 is a schematic circuit block diagram of a load 133 shown according to another embodiment of the invention. The photosensitive element 132, the load 133, and the reading circuit 120 shown in FIG. 9 may be used as one of a plurality of embodiments of the photosensitive element 132, the load 133, and the reading circuit 120 shown in FIG. 4. For the photosensitive element 132 and the reading circuit 120 shown in FIG. 9, reference may be made to the related descriptions of the photosensitive element 132 and the reading circuit 120 shown in FIG. 8, so details are not repeated herein. In the embodiment shown in FIG. 9, the load 133 includes a transistor P9. The first terminal (e.g., source) of the transistor P9 is coupled to the power voltage Vpower. The level of the power voltage Vpower shown in FIG. 9 may be set according to actual design. The second terminal (e.g., drain) of the transistor P9 is coupled to the photosensitive element 120. The control terminal (e.g., gate) of the transistor P9 is coupled to a bias voltage Vb2. Different bias voltages Vb2 may determine the "transformation relationship between the photovoltage Vphoto and the photocurrent Iphoto". The bias voltage Vb2 may be set according to actual design. For example, in some embodiments, the level of the bias voltage Vb2 may be the same as the level of the bias voltage Vb1.

Figure 10:
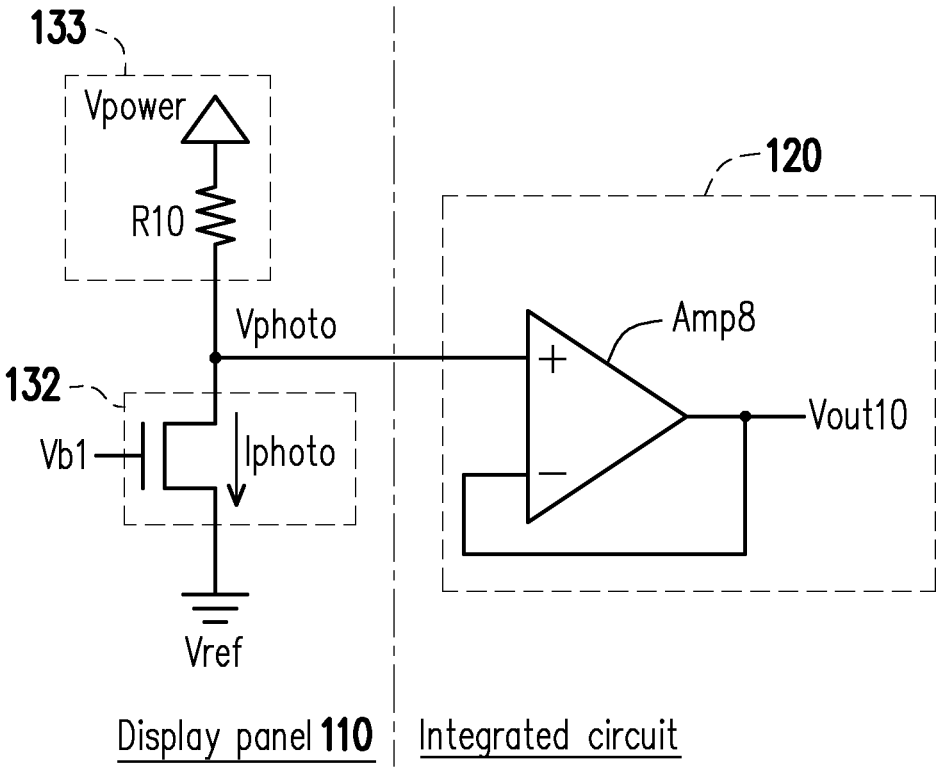
FIG. 10 is a schematic circuit block diagram of a load shown according to an embodiment of the invention.

FIG. 10 is a schematic circuit block diagram of a load 133 shown according to another embodiment of the invention. The photosensitive element 132, the load 133, and the reading circuit 120 shown in FIG. 10 may be used as one of a plurality of embodiments of the photosensitive element 132, the load 133, and the reading circuit 120 shown in FIG. 4. For the photosensitive element 132 and the reading circuit 120 shown in FIG. 10, reference may be made to the related descriptions of the photosensitive element 132 and the reading circuit 120 shown in FIG. 8, so details are not repeated herein. In the embodiment shown in FIG. 10, the load 133 includes a resistor R10. The first terminal of the resistor R10 is coupled to the power voltage Vpower. The level of the power voltage Vpower shown in FIG. 10 may be set according to actual design. The second terminal of the resistor R10 is coupled to the photosensitive element 120 and the reading circuit 120. The resistance value of the resistor R10 may be set according to actual design. Different resistance values of the resistor R10 may determine the "transformation relationship between the photovoltage Vphoto and the photocurrent Iphoto".

Based on the above, the display panel 110 of the embodiments has the photosensitive circuit 130. The photosensitive circuit 130 is embedded in the TFT layer 115 of the display panel 110, so the ambient light 10 may reach the photosensitive circuit 130 through a few layers of the display panel 110, thereby alleviating the low signal display transmission issue. Furthermore, the photosensitive element 132 (or 131) of the photosensitive circuit 130 may instantly reflect the intensity of the ambient light 10 in the photocurrent Iphoto. Therefore, the sensing operation of the photosensitive circuit 130 does not need to be divided into three working stages: reset charging, exposure, and electric signal collection. Accordingly, compared with the operation process of the conventional ambient light sensor (color temperature sensor), the time for reading the photosensitive element 132 (or 131) may be shortened.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A display panel, comprising:
an upper substrate;
a lower substrate;
a color filter film;
a thin-film transistor layer disposed between the upper substrate and the lower substrate, wherein a plurality of thin-film transistors of a pixel array of the display panel are disposed in the thin-film transistor layer;
a polarizing film disposed between the upper substrate and the thin-film transistor layer, wherein the color filter film is disposed between the polarizing film and the thin-film transistor layer; and
a photosensitive circuit disposed in the thin-film transistor layer and configured to sense an ambient light, wherein the photosensitive circuit comprises:
a photosensitive element configured to sense the ambient light to determine a photocurrent flowing through the photosensitive element, wherein a reading circuit reads the photocurrent of the photosensitive element to learn about the ambient light, and the ambient light passes through the color filter film before being sensed by the photosensitive element.

2. The display panel of claim 1, wherein the upper substrate comprises a cover glass, and the lower substrate comprises a polyimide film and a polyester film.

3. The display panel of claim 1, wherein the photosensitive circuit is disposed at an edge portion of the display panel.

4. The display panel of claim 1, wherein the photosensitive circuit comprises:
a photosensitive element configured to sense the ambient light to determine a photocurrent flowing through the photosensitive element; and
a load coupled to the photosensitive element to convert the photocurrent into a photovoltage, wherein a reading circuit reads the photovoltage to learn about the ambient light.

5. The display panel of claim 4, wherein the load comprises:
a transistor having a first terminal coupled to a power voltage, wherein a second terminal of the transistor is coupled to the photosensitive element, and a control terminal of the transistor is coupled to the second terminal of the transistor.

6. The display panel of claim 4, wherein the load comprises:

a transistor having a first terminal coupled to a power voltage, wherein a second terminal of the transistor is coupled to the photosensitive element, and a control terminal of the transistor is coupled to a bias voltage.

7. The display panel of claim 4, wherein the load comprises:

a resistor having a first terminal coupled to a power voltage, wherein a second terminal of the resistor is coupled to the photosensitive element.

8. The display panel of claim 1, wherein the photosensitive circuit comprises:

a photosensitive element configured to sense the ambient light to determine a photocurrent flowing through the photosensitive element, wherein the photosensitive element is a photosensitive thin-film transistor.

9. The display panel of claim 1, wherein the photosensitive circuit comprises:

a photosensitive element configured to sense the ambient light to determine a photocurrent flowing through the photosensitive element, wherein the photosensitive element is a gap-type thin-film transistor, and a gate length of the gap-type thin-film transistor is less than a channel length between a source and a drain of the gap-type thin-film transistor.

10. A display device, comprising:

a display panel comprising an upper substrate, a lower substrate, a thin-film transistor layer, a color filter film and a photosensitive circuit, wherein the thin-film transistor layer is disposed between the upper substrate and the lower substrate, a plurality of thin-film transistors of a pixel array of the display panel are disposed in the thin-film transistor layer, a polarizing film is disposed between the upper substrate and the thin-film transistor layer, the color filter film is disposed between the polarizing film and the thin-film transistor layer, and the photosensitive circuit is disposed in the thin-film transistor layer to sense an ambient light; and a reading circuit coupled to the photosensitive circuit to read a sensing result, wherein the photosensitive circuit comprises:

a photosensitive element configured to sense the ambient light to determine a photocurrent flowing through the photosensitive element, wherein the reading circuit reads the photocurrent of the photosensitive element to learn about the ambient light, and the ambient light passes through the color filter film before being sensed by the photosensitive element.

11. The display device of claim 10, wherein the upper substrate comprises a cover glass, and the lower substrate comprises a polyimide film and a polyester film.

12. The display device of claim 10, wherein the photosensitive circuit is disposed at an edge portion of the display panel.

13. The display device of claim 10, wherein the reading circuit comprises:

an amplifier having a first input terminal coupled to a reference voltage, wherein a second input terminal of the amplifier is coupled to the photosensitive element; and

a resistor having a first terminal coupled to the second input terminal of the amplifier, wherein a second terminal of the resistor is coupled to an output terminal of the amplifier.

14. The display device of claim 10, wherein the reading circuit comprises:

a current source;

a resistor having a first terminal coupled to a power voltage; and a current mirror having a master current terminal coupled to the current source and the photosensitive element, wherein a slave current terminal of the current mirror is coupled to a second terminal of the resistor.

15. The display device of claim 10, wherein the reading circuit comprises:

a first current source;

a second current source;

a current mirror, wherein a first terminal of a master current path of the current mirror is coupled to the first current source, a first terminal of a slave current path of the current mirror is coupled to the second current source, and a second terminal of the slave current path of the current mirror is coupled to the photosensitive element;

a first transistor having a first terminal coupled to a second terminal of the master current path of the current mirror, wherein a second terminal of the first transistor is coupled to a reference voltage, and a control terminal of the first transistor is coupled to a control voltage;

a second transistor having a first terminal coupled to the second terminal of the slave current path of the current mirror, wherein a second terminal of the second transistor is coupled to the reference voltage, and a control terminal of the second transistor is coupled to the control voltage;

a resistor having a first terminal coupled to a power voltage; and a third transistor having a first terminal coupled to a second terminal of the resistor, wherein a second terminal of the third transistor is coupled to the second terminal of the master current path of the current mirror, and a control terminal of the third transistor is coupled to the first terminal of the slave current path of the current mirror.

16. The display device of claim 10, wherein the photosensitive circuit comprises:

a photosensitive element configured to sense the ambient light to determine a photocurrent flowing through the photosensitive element; and a load coupled to the photosensitive element to convert the photocurrent into a photovoltage, wherein the reading circuit reads the photovoltage to learn about the ambient light.

17. The display panel of claim 16, wherein the load comprises:

a transistor having a first terminal coupled to a power voltage, wherein a second terminal of the transistor is coupled to the photosensitive element and the reading circuit, and a control terminal of the transistor is coupled to the second terminal of the transistor.

18. The display panel of claim 16, wherein the load comprises:

a transistor having a first terminal coupled to a power voltage, wherein a second terminal of the transistor is coupled to the photosensitive element and the reading circuit, and a control terminal of the transistor is coupled to a bias voltage.

19. The display panel of claim 16, wherein the load comprises:

a resistor having a first terminal coupled to a power voltage, wherein a second terminal of the resistor is coupled to the photosensitive element and the reading circuit.

20. The display device of claim 16, wherein the reading circuit comprises:

an amplifier having a first input terminal coupled to the photosensitive element and the load to receive the photovoltage, wherein a second input terminal of the amplifier is coupled to an output terminal of the amplifier.

21. The display device of claim 10, wherein the photosensitive circuit comprises:

a photosensitive element configured to sense the ambient light to determine a photocurrent flowing through the photosensitive element, wherein the photosensitive element is a photosensitive thin-film transistor.

22. The display device of claim 10, wherein the photosensitive circuit comprises:

a photosensitive element configured to sense the ambient light to determine a photocurrent flowing through the photosensitive element, wherein the photosensitive element is a gap-type thin-film transistor, and a gate length of the gap-type thin-film transistor is less than a channel length between a source and a drain of the gap-type thin-film transistor.

\* \* \* \* \*